United States Patent

Sua et al.

[11] Patent Number: 5,619,067
[45] Date of Patent: Apr. 8, 1997

[54] SEMICONDUCTOR DEVICE PACKAGE SIDE-BY-SIDE STACKING AND MOUNTING SYSTEM

[75] Inventors: Goh J. Sua; Chan M. Yu, both of Singapore, Singapore

[73] Assignee: Texas Instruments Incorporated, Dallas, Tex.

[21] Appl. No.: 236,768

[22] Filed: May 2, 1994

[51] Int. Cl.$^6$ ............................ H01L 23/04; H01L 23/32
[52] U.S. Cl. ...................... 257/686; 257/704; 257/723; 257/730; 257/731; 361/730; 361/735; 361/740
[58] Field of Search .................................... 257/723, 724, 257/704, 730, 731, 732, 685, 686, 712, 713; 361/729, 730, 735, 740, 807, 809; 437/51, 208, 915

[56] References Cited

U.S. PATENT DOCUMENTS

| | | | |
|---|---|---|---|
| Re. 34,794 | 11/1994 | Farnworth | 257/733 |
| 4,656,605 | 4/1987 | Clayton | 257/724 |
| 4,667,270 | 5/1987 | Yagi | 361/809 |
| 4,706,166 | 11/1987 | Go | 257/676 |
| 4,975,763 | 12/1990 | Baudouin et al. | 361/807 |
| 5,109,317 | 4/1992 | Miyamoto et al. | 257/719 |
| 5,279,029 | 1/1994 | Burns | 437/209 |
| 5,349,235 | 9/1994 | Lee et al. | 257/723 |
| 5,362,986 | 11/1994 | Angiulli et al. | 257/723 |
| 5,413,970 | 5/1995 | Russell | 437/208 |

FOREIGN PATENT DOCUMENTS

| | | | |
|---|---|---|---|
| 0248451 | 11/1986 | Japan | 257/704 |
| 0274479 | 11/1989 | Japan | 257/731 |
| 0132250 | 5/1992 | Japan | 257/731 |

*Primary Examiner*—Peter Toby Brown
*Attorney, Agent, or Firm*—Warren L. Franz; Wade James Brady, III; Richard L. Donaldson

[57] ABSTRACT

The invention is to an array of stacked devices utilizing vertical surface mounted semiconductor devices stacked side by side and inserting the stack of devices into a casing. The packaged stack of devices creates a cube package which is capable of replacing SIMM boards, and saves considerable space. The casing dissipates heat generated in the devices, and may be of metal or thermally conductive plastic.

26 Claims, 4 Drawing Sheets

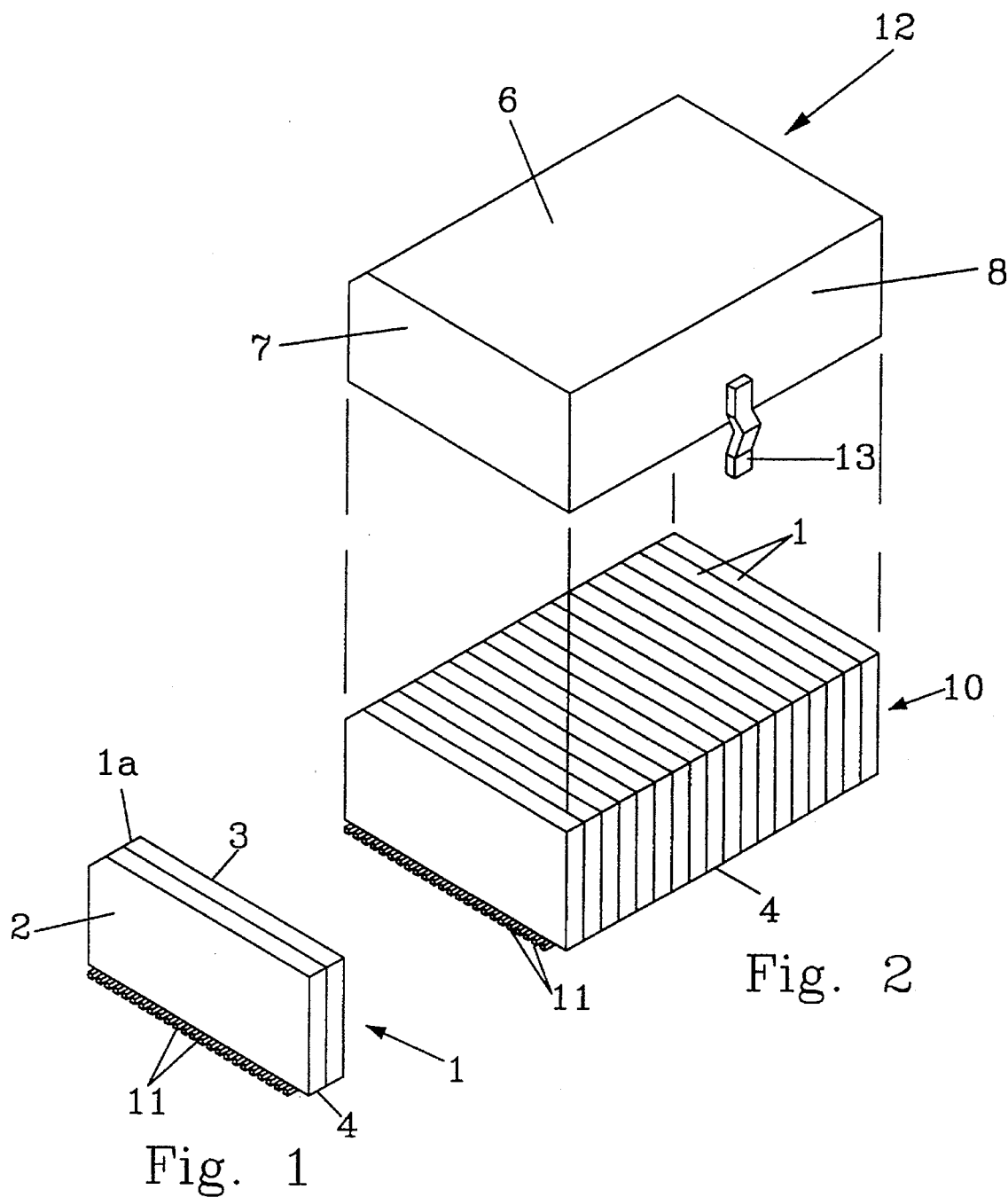

SEMICONDUCTOR DEVICE PACKAGE SIDE-BY-SIDE STACKING AND MOUNTING SYSTEM

FIELD OF THE INVENTION

This invention relates to semiconductor devices, and more particularly to a system for stacking multiple semiconductor device packages in a casing and mounting the stacked packages onto a circuit board.

BACKGROUND OF THE INVENTION

Memory devices used, particularly in computers, are arrayed on the computer circuit board, or mounted on small circuit boards to group encapsulated memory device packages into a distinct amount of memory capacity. For example, SIMM (Semiconductor Integrated Memory Module) devices, utilize several memory device packages interconnected on a small circuit board to form memory modules. The devices comprise integrated circuit memory chips encapsulated into discrete protective packages, with electrical connections established by soldering exposed chip contact leads onto corresponding contacts of the circuit board. The sockets into which the memory circuit boards are mounted on the computer circuit board occupy considerable space, especially if the computer is to be designed to utilize 4-Mbytes or more of memory. As computer boards become more complex, and additional functions are integrated into the computer circuit board, the space required for individual memory devices and SIMM modules needs to be reduced to accommodate other circuitry.

SUMMARY OF THE INVENTION

The invention is to an array of stacked devices utilizing vertical surface mounted semiconductor devices stacked side by side and inserting the stack of devices into a casing. The packaged stack of devices creates a cube package which is capable of replacing SIMM boards, and saves considerable space. The casing dissipates heat generated in the devices, and may be of metal or thermally conductive plastic.

The casing has two side clips which clip directly onto the circuit board on which the devices are to be mounted. The devices, which normally are attached to a circuit board by solder reflow, may be tightly clamped to contact pads on the circuit board, avoiding the necessity to solder the devices to the circuit board, and allowing the devices to be removed, when defective, without the need to remove a solder connection. Larger memory arrays are possible in a smaller space by stacking or joining a number of arrays together.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 illustrates a single vertical surface mount semiconductor device;

FIG. 2 shows an array f several vertical surface mount devices, and a casing for enclosing the devices;

DESCRIPTION OF PREFERRED EMBODIMENT

Figure 3:
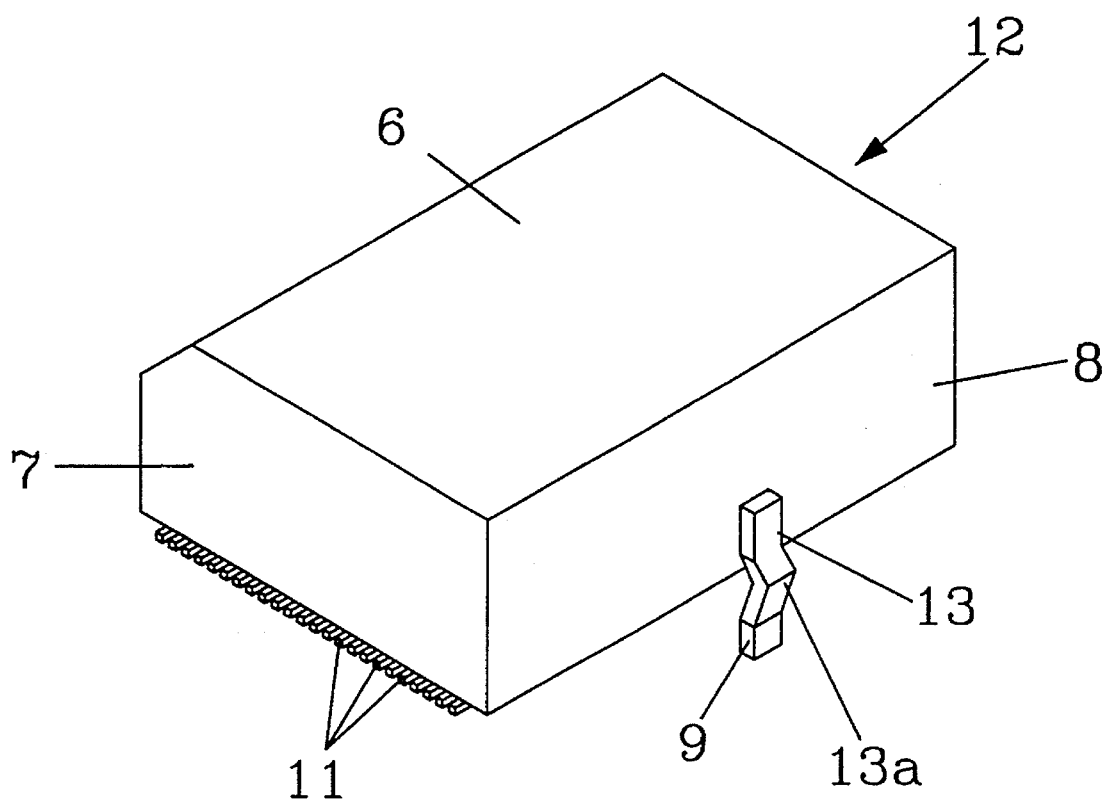
FIG. 3 shows the encased devices.

FIG. 1 shows a vertical surface mount device 1 which comprises an encapsulated integrated circuit memory chip having generally planar and parallel, rectangular front and rear side faces 2, 3 top left and right edges; and a plurality of contacts 11 extending out from a bottom edge 4 of the packaged device. Device 1 is usually flow soldered onto a circuit board having a contact pad for each contact 11.

FIG. 2 shows an array 10 of nine discrete identical vertical surface mount devices 1 stacked horizontally together, side by side with their side faces 2, 3 brought into adjacent superposed relationships so that a front face 2 of one device 1 package abuts a rear face 3 of a neighboring device 1 package and so that their top, left, right and bottom edges 4 are respectively aligned in common planes, with the contacts 11 of the device packages extending respectively out of the bottom edge plane of stack 10 of the arrayed devices. More or fewer device packages may be encased, depending upon the particular application. Aligned top edges, end ones of the front and rear faces, and aligned left and right edges of the stacked device packages respectively define a top, ends and sides of the array. A case 12 is shown positioned above the horizontally arrayed device packages. Case 12 is placed over the stacked device packages and encloses them as illustrated in FIG. 3. As shown, case 12 has a generally rectangular bottom parallelepiped box-like construction, with a bottom opening internal cavity 5 (see FIG. 4) defined by internal surfaces of top, front and rear end, and right and left side walls 6, 7, 8. The dimensions of cavity 5 are chosen so that the open bottom of case 12 can be placed over the array 10, to hold the packages together by bringing the top, ends and sides of array 10 into corresponding abutment with top, end and side surfaces 6, 7, 8 of cavity 5, leaving contacts 11 exposed and accessible through the open bottom of case 12. There are two clips 13, only one shown in FIG. 3, located in spaced positions, attached to respective opposite sides 8 of case 12. The clips 13 have depending leading ends 9 which are inserted respectively into correspondingly spaced holes in a circuit board, described below, to hold the case and arrayed device packages in contact with contact pads on a circuit board. The clips are made, for example from a spring-leaf material, and have a V-notch 13a for securing the clips by snap action within the holes in the circuit board.

Figure 4:
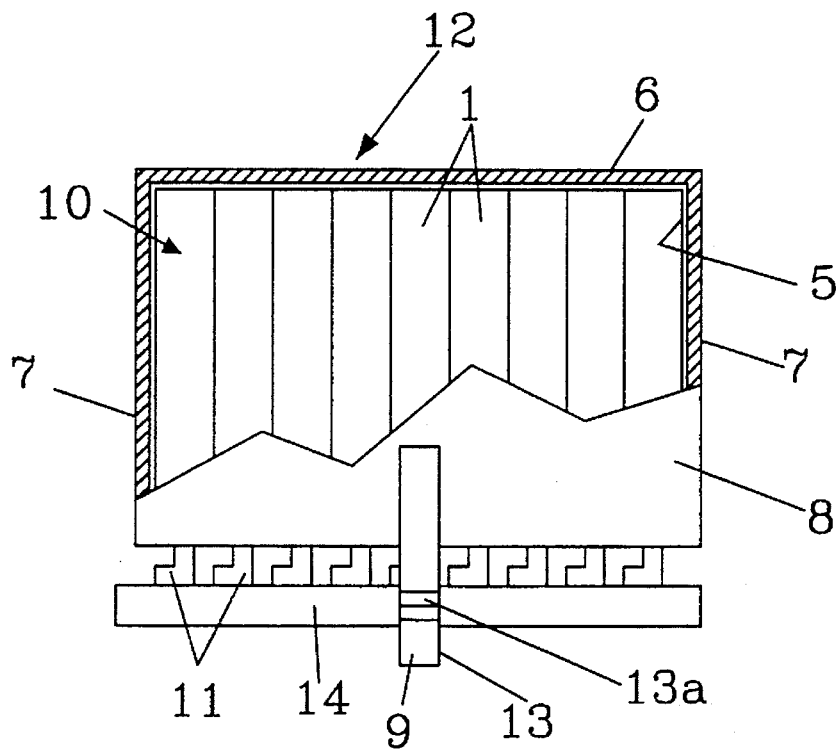
FIG. 4 shows encased devices on a circuit board with a side cut-away showing the devices.

FIG. 4 shows an end view of the arrayed packaged devices 1 in a case 12, with a portion of the case cut away to show the packaged devices in case 12. Contacts 11, which extend below the bottom of case 11, are in contact with circuit board 14. Clip 13 extends through a hole in circuit board 14.

Figure 5:
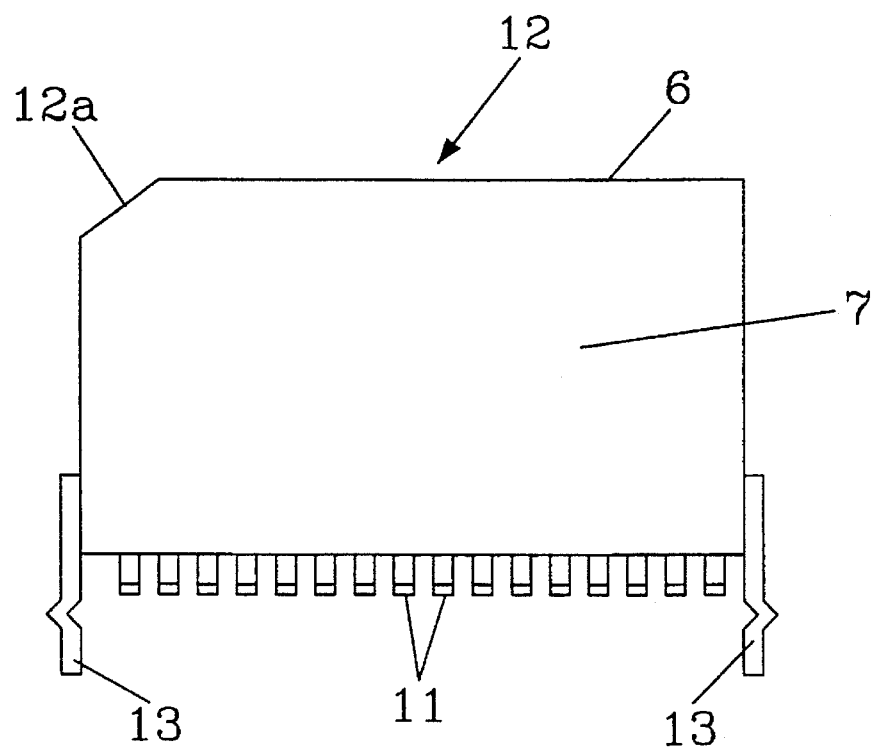
FIG. 5 is a side view of the cased devices.

FIG. 5 is a side view of the encased array 10 of packaged devices 1. Case 12 conforms at an angled cut-off top corner edge 12a with a correspondingly angled top edge of the stacked array 10 defined by aligned chamfered edges 1a of the package exteriors of devices 1, as shown in FIG. 1. The conforming of an angled top corner of case 12 with the corresponding aligned angled chamfered edges of the package exteriors of devices 1 helps hold devices 1 in position within case 12 and presents more surface area of each device package in contact with the case. This is important since case 12 also serves as a heat sink for the cased devices. Case 12 may be either metal or a thermally conductive plastic to assist in dissipating heat generated by the devices. Both clips 13 are shown in FIG. 5. The two clips securely hold case 12 over packaged devices 1 against a circuit board on which the packaged devices are mounted.

Figure 6:
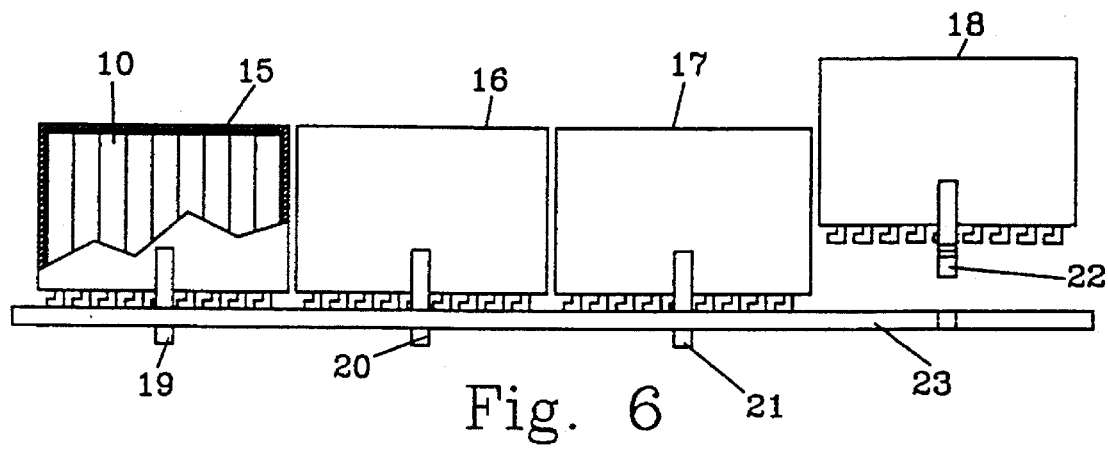
FIG. 6 shows four sets of cased devices on a circuit board.

FIG. 6 shows four sets of cased devices. As an example, if devices 1 are 1-Mbyte memory devices, each cased array 10 represents a 9×1-Mbyte array, providing 1 Mbyte of memory. Eight devices are needed to provide a 1-Mbyte× 8-bit memory array. Eight devices in a case provide the 1-Mbyte×8-byte memory array. The ninth chip provides a ninth bit for parity. The four cased arrays 10 then provide 4 Mbytes of memory, which is commonly used in computer systems.

Figure 7:
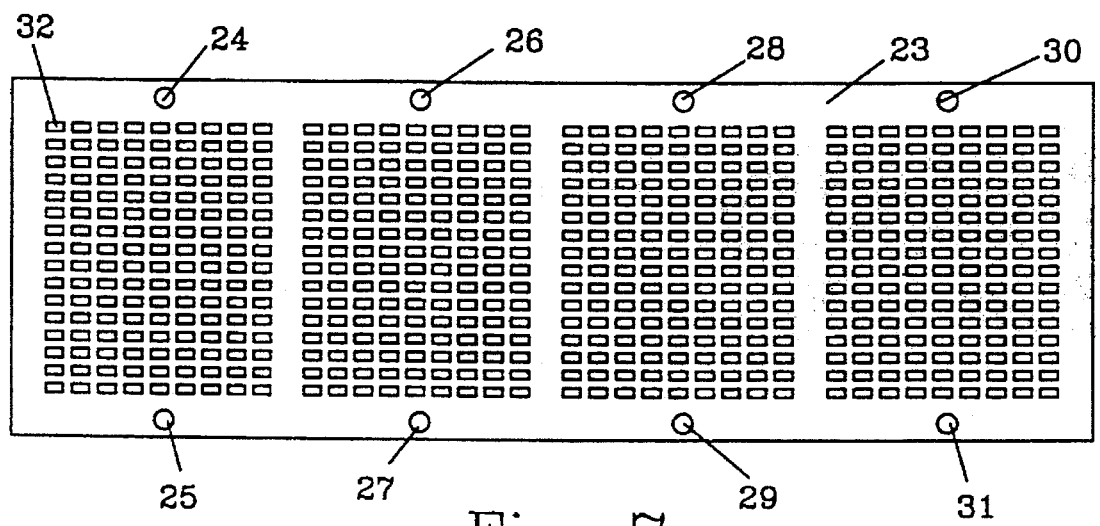
FIG. 7 shows the top of the circuit board with the arrayed contact pads for mounting the devices.

FIG. 7 shows the top of a circuit board 23 with contacts 32 arrayed for the four cased arrays in FIG. 6. In the illustrated example, each packaged device has 16 pins. Therefore, to provide contacts to each pin on each chip, an array of 16×9 contacts is needed for each cased array. In practice, the mounting area required by the four cased arrays is less than the space required by four SIMM modules.

Circuit board 23 has four sets of holes 24–31, one set for each 16×9 array of contacts. Clips 19–22 lock in holes 25–31 and another set of clips (not illustrated) lock into holes 24–30, to hold cased arrays 15–18 on circuit board 23. When the clips are locked into the holes on circuit board 23, sufficient down-pressure is exerted on the device packages to hold the device contacts in electrical contact with contact pads 32. Therefore, it is not necessary to flow solder the contacts on the devices to the contact pads on the circuit board.

What is claimed:

1. A system for mounting multiple packaged semiconductor devices on a circuit board, said system comprising:

a circuit board having contact pads thereon;

a plurality of discrete encapsulated vertical surface mount semiconductor device packages, each package having an exterior with front and rear side faces and top, left, fight and bottom edges, with contact leads extending out from said bottom edges; said device packages being positioned vertically and stacked horizontally in a side-by-side array with said side faces brought into adjacent superposed relationships so that a front face of one device package abuts a rear face of a neighboring device package and so that said device package top, left, right and bottom edges are respectively aligned in common planes, with the contact leads of the device packages extending out of the bottom edge common plane; said aligned top edges, end ones of said front and rear faces and aligned left and right edges of the stacked device packages respectively defining top, ends and sides of the array;

a case having a box-like construction, with an open bottom and an internal cavity defined by top, end and side internal surfaces, said case placed over said side-by-side array of device packages to bring said top, ends and sides of the array into corresponding abutment with said top, end and sides surfaces of said cavity, leaving said contact leads exposed and accessible through said case open bottom; and means on said case, cooperative with said circuit board, releasably securing said case with said array onto said board, pressing said exposed contact leads respectively against said contact pads, establishing solderless electrical connection between said leads and said pads.

2. The system according to claim 1, wherein said case is made from a heat conducting material.

3. The system according to claim 1, wherein said means for securing comprises clips made from a spring-leaf material, and said clips have a V-notch section for locking said clips into holes in said circuit board.

4. The system of claim 1, wherein said plurality of semiconductor device packages comprises eight identical memory chip device packages stacked together within said case cavity to form a single memory module.

5. The system of claim 4, wherein said each device package comprises 16 contact leads.

6. The system of claim 1, wherein each semiconductor device package has generally coplanar and parallel rectangular front and rear side faces; and wherein said case has a generally rectangular parallelepiped construction.

7. A system for mounting multiple packaged semiconductor devices on a circuit board, said system comprising:

a plurality of semiconductor devices, each device comprising an integrated circuit chip encapsulated into a discrete protective package and having contact leads extending out of an edge of said package, said device packages being positioned vertically in alignment in a side-by-side array;

a case having an internal cavity with an open bottom, enclosing said array of semiconductor device packages, leaving said contact leads exposed through said case open bottom;

a circuit board having contact pads thereon; and means on said case, cooperative with said board, releasably securing said case and enclosed semiconductor device packages to said circuit board and pressing said leads respectively against said pad, establishing solderless electrical connection between said leads and said pads.

8. The system according to claim 7, wherein said array has external contour and said case internal cavity has an internal contour that conforms to said external contour; said case enclosing said array with said external contour in abutment with said internal contour.

9. The system according to claim 8, wherein said case is made from a heat conducting material.

10. The system according to claim 7, wherein said circuit board has holes and said securing means comprises clips inserted into said holes.

11. The system according to claim 10, wherein said clips are made from a spring-leaf material, and have a V-notch section for locking into said holes.

12. A system for mounting multiple packaged semiconductor devices on a circuit board, said system comprising:

a circuit board having contact pads thereon;

a plurality of discrete vertical surface mount semiconductor devices; each device comprising an integrated circuit chip encapsulated in a protective package having an exterior configuration with front and rear side faces, a bottom edge, and contact lead extending out from said bottom edge;

a case having top, end and side walls with internal surfaces defining an internal cavity with an open bottom; said plurality of semiconductor device packages being stacked into adjacent superposed relationships in an array, and held together by contact of said array with said internal surfaces of said cavity, with said bottom edges aligned so that said contact leads of said respective semiconductor devices extend out from said stack through said casing open bottom; and means, located on said case, securing said casing to said circuit board, tightly clamping said contact leads respectively into solderless electrical connections with said contact pads.

13. The system of claim 12, wherein said semiconductor device packages are stacked in said array, with front faces of said packages positioned in abutment with rear faces of neighboring ones of said packages.

14. The system of claim 13, wherein said array has a top, ends and sides; and wherein said top, ends and sides of said array are in respective abutment with said internal surfaces of said top, ends and sides of said internal cavity.

15. The system of claim 14, wherein said exterior configurations of said semiconductor device packages further have chamfered corners; said chamfered corners are aligned in said array to form an angled edge; said case has an internal surface angled to define a corresponding angled edge of said cavity; and said angled edge of said array is in abutment with said angled edge of said cavity.

16. The system of claim 15, wherein said means for securing said case comprises at least one projection which yields elastically to lock said array-fried casing against said board.

17. The system of claim 16, wherein said at least one projection comprises at least one spring-leaf clip.

18. The system according to claim 12, wherein said means for securing comprises means for releasably securing said casing to said circuit board.

19. An electrical circuit, comprising:

a circuit board having a plurality of arrays of contact pads;

a plurality of cases, each case having top, end and side wells with internal surfaces defining an internal cavity with an open bottom;

a plurality of discrete encapsulated semiconductor device packages associated with each case; said packages each having front and rear side faces, a bottom edge, and contact leads extending from said bottom edge; and the packages of each of said plurality of packages being stacked vertically in side-by-side relationships within the respective internal cavity of each case, each case holding said packages in an array with said front and rear side faces in superposed relationships and said bottom edges aligned to present said bottom edges of the respective packages of each case in generally planar alignment and said associated contact leads exposed in an array at said open bottom; and means, associated with each case, securing each case to said circuit board, clamping said packages against, said board to establish solderless electrical connections between contact leads of said contact arrays and respective pads of said contact pad arrays.

20. The electrical circuit of claim 19, wherein said board includes a receptacle adjacent each contact pad array, and said means for securing, comprises a clip on each casing having a leading end inserted within said receptacle.

21. The electrical circuit of claim 20, wherein said receptacle is a hole; said clip is a resilient member that can be snapped into said hole; and said cases, semiconductor devices, and circuit board are relatively dimensioned and configured so that when said dips are mapped into said holes, said contacts are clamped against said pads.

22. A system for packaging and mounting a plurality of semiconductor devices, comprising:

a circuit board with contact pads;

a plurality of discrete vertical surface mount semiconductor devices; each device having front and rear side faces, a bottom edge, and contact leads extending out from said bottom edge;

a case having top, end and side walls with internal surfaces defining an internal cavity with an open bottom; said plurality of discrete semiconductor devices being stacked side by side within said cavity to form an array matching said internal surfaces, said front and rear faces brought into adjacent superposed relationships, with front faces of ones of said devices positioned in abutment with rear faces of neighboring ones of said devices, and said bottom edges aligned so that said contact leads of said respective semiconductor devices extend out from said stack through said case open bottom; and means, located on said case, for securing said case to said circuit board to hold said array within said cavity and clamp said contact leads into respective solderless electrical connections with said contact pads.

23. The system of claim 22, wherein said semiconductor devices further have chamfered corners; said chamfered corners are aligned in said array to form an angled edge; said case has an internal surface angled to define a corresponding angled edge of said cavity; and said angled edge of said array is in abutment with said angled edge of said cavity.

24. The system of claim 23, wherein said circuit board has at least one, receptacle; and said means for securing said case comprises at least one projection which yields elastically to lock said projection within said at least one receptacle.

25. The system of claim 24, wherein said at least one receptacle comprises at least one hole; and said at least one projection comprises at least one spring leaf clip.

26. A semiconductor package system for mounting an array of multiple devices comprising:

a circuit board having contact pads;

a plurality of discrete vertical surface mount semiconductor device packages having front and rear side faces and bottom edges with contact leads extending out from said bottom edges; said device packages being positioned in a side-by-side array with said side faces in adjacent superposed relationships and said bottom edges aligned in a common plane; said array having external contour;

a case having an internal cavity with an internal contour that conforms to said array external contour; said internal cavity enclosing said array of discrete semiconductor device packages and having an opening leaving said contact leads exposed; and means on said case, cooperative with said board, clamping said array within said cavity against said board pressing said exposed contact leads against said pads to establish respective solderless electrical connections between said leads and said pads.

* * * * *